US008378981B2

(12) United States Patent
Yilmaz et al.

(10) Patent No.: US 8,378,981 B2
(45) Date of Patent: Feb. 19, 2013

(54) CAPACITIVE SENSING WITH HIGH-FREQUENCY NOISE REDUCTION

(75) Inventors: Esat Yilmaz, Chandler's Ford (GB); Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 617 days.

(21) Appl. No.: 12/466,230

(22) Filed: May 14, 2009

(65) Prior Publication Data

US 2009/0303198 A1    Dec. 10, 2009

Related U.S. Application Data

(60) Provisional application No. 61/054,186, filed on May 19, 2008.

(51) Int. Cl.
*G06F 3/041* (2006.01)
*G01D 5/12* (2006.01)

(52) U.S. Cl. .................. 345/173; 345/174; 178/18.06; 341/33; 324/678

(58) Field of Classification Search .............. 345/173, 345/174; 178/18.06; 341/33, 22; 324/768, 324/678

See application file for complete search history.

(56) References Cited

U.S. PATENT DOCUMENTS

| | | | |
|---|---|---|---|
| 5,730,165 A * | 3/1998 | Philipp | 137/1 |
| 6,452,514 B1 * | 9/2002 | Philipp | 341/33 |
| 6,466,036 B1 * | 10/2002 | Philipp | 324/678 |
| 7,256,714 B2 * | 8/2007 | Philipp | 341/33 |
| 7,288,946 B2 * | 10/2007 | Hargreaves et al. | 324/678 |
| 7,567,240 B2 * | 7/2009 | Peterson et al. | 345/173 |
| 7,663,607 B2 * | 2/2010 | Hotelling et al. | 345/173 |
| 7,755,614 B2 * | 7/2010 | Liao et al. | 345/173 |
| 8,018,440 B2 * | 9/2011 | Townsend et al. | 345/173 |
| 2005/0052429 A1 * | 3/2005 | Philipp | 345/173 |
| 2005/0099188 A1 * | 5/2005 | Baxter | 324/678 |
| 2009/0303203 A1 | 12/2009 | Yilmaz et al. | |

FOREIGN PATENT DOCUMENTS

| | | |
|---|---|---|
| WO | WO-9723738 A1 | 7/1997 |
| WO | WO-0044018 | 7/2000 |

* cited by examiner

*Primary Examiner* — Quan-Zhen Wang
*Assistant Examiner* — Michael J Eurice
(74) *Attorney, Agent, or Firm* — Baker Botts L.L.P.

(57) ABSTRACT

A method and apparatus for sensing the presence of a body from a change in an amount of charge present on a capacitively charged key includes performing a measurement burst which generates a plurality of signal sample values from a plurality of measurement cycles. Each of the measurement cycle includes inducing charge onto the key during a drive part of the measurement cycle, measuring during a signal measurement part of the measurement cycle the charge induced on the key during the drive part of the measurement cycle, and generating a signal sample value to represent of the charge measured from the key during the signal measurement part of the measurement cycle. The method includes comparing the value of the plurality of the signal sample values of the measurement burst with a determined range of accepted values between a determined maximum and a determined minimum value, and processing any of the plurality of signal sample values, which are outside the determined accepted range to the effect that the presence of the body can be determined only from a change in the value of one or more of the plurality of signal samples which are within the determined accepted range. By removing the effects of signal sample values, which are outside the determined accepted range of values, then the effects of noise, such as rectangular noise, which might otherwise cause a body to be erroneously detected can be substantially reduced.

20 Claims, 11 Drawing Sheets

CAPACITIVE SENSING WITH HIGH-FREQUENCY NOISE REDUCTION

RELATED APPLICATIONS

This application claims the benefit under 35 U.S.C. 119(e) of U.S. Provisional Patent Application Ser. No. 61/054,186, filed on May 19, 2008, which is incorporated herein by reference in its entirety.

FIELD

The present invention relates to methods and apparatus for sensing the presence of a body from a change in an amount of charge present on a capacitively charged key. The present invention also relates to touch sensitive control panels which include a plurality of keys, which can be arranged in a matrix and can be used to form, for example, a two dimensional touch sensitive user input device.

In some embodiments a touch sensor includes a key comprising a drive plate and a sense plate, in which a charge signal may be measured after the key is driven during a measurement cycle.

BACKGROUND

Touch sensitive control devices are now prevalent on many electronic devices such as mobile phones, MP3 players, personal digital assistants as well as white goods such as cookers and freezers. This is because they are space saving in terms of an amount of "surface real estate" available to position user controls, robust in that there is a reduction in the amount of mechanical components required in their implementation and they can also be made to resist potentially harmful substances in an environment in which they are disposed. For the example of white goods, the presence of water and other aqueous substances is typically harmful to contact switches. Therefore, the touch sensitive switch can be disposed behind a protective layer preventing damage from being caused by the aqueous substances. Furthermore, a touch sensitive control can be disposed in front of a display screen such as for example an LCD display screen with the effect that a user can select a particular function by touching the screen at a position at which a particular menu option has been displayed.

There are various forms of touch sensitive controls which use a capacitive sensor to sense the presence of a body such as a user's finger. A touch sensitive capacitive sensor for example is disclosed in WO-97/23738. In WO-97/23738 a single coupling plate is provided and disposed to form a touch sensitive switch. The touch sensitive plate is referred to as a key. In accordance with this example, the key is charged using a drive circuit for a drive part of a measurement cycle and then this charge is measured by transferring the induced charge from the key by a charge detection circuit during a measurement part of the cycle. The charging and transferring parts of the cycle can vary widely and can be selected in accordance with the application concerned. Typically, a burst of measurement cycles are used to generate a plurality of signal sample values. The sensor can detect the presence of an object near the key as a result of a change in an amount of the charge induced onto the key, even in the presence of interfering substances.

Another form of touch sensitive control is disclosed in WO-00/44018. In this example a pair of electrodes are provided which act as a key so that the presence of a body such as a users finger is detected as a result of a change in an amount of charge which is transferred between the two electrodes. With this arrangement, one of the electrodes (labelled X) is driven with a drive circuit and the other of the pair of electrodes (labelled Y) is connected to a charge measurement circuit which detects an amount of charge present on the Y plate when driven by the X plate. As disclosed in WO-00/440018 several pairs of electrodes can be arranged to form a matrix of sensing areas which can provide an efficient implementation of a touch sensitive two-dimensional position sensor. Such two dimensional capacitive transducing sensors are typically used with devices which include touch sensitive screens or touch sensitive keyboards/keypads which are used in the example of consumer electronic devices and domestic appliances. As indicated above, such two dimensional capacitive touch sensors can be used in conjunction with liquid crystal displays or cathode ray tubes to form such touch sensitive screens.

Although touch sensitive capacitive sensors such as those described above and disclosed in the above-mentioned disclosures have been successfully deployed in many applications, some applications can present a challenging environment for detecting a change in charge as a result of the presence of a body. For example, noise which may be present for a particular application can cause a disruption in accurately measuring an amount of charge transferred from a capacitively charged key for the various examples set out above.

SUMMARY

According to the present invention there is provided a method and apparatus for sensing the presence of a body from a change in an amount of charge present on a capacitively charged key. The method includes performing a measurement burst which generates a plurality of signal sample values from a plurality of measurement cycles. Each of the measurement cycles includes inducing charge onto the key during a drive part of the measurement cycle, and during a signal measurement part of the measurement cycle measuring the charge induced on the key during the drive part of the measurement cycle, and generating a signal sample value to represent the charge measured from the key during the signal measurement part of the measurement cycle. The method includes comparing the value of the plurality of the signal sample values of the measurement burst with a determined range of accepted values between a determined maximum and a determined minimum value, and processing any of the plurality of signal sample values, which are outside the determined accepted range to the effect that the presence of a body can be determined from a change in the value of one or more of the plurality of signal samples which are within the determined accepted range. Thus, for example, only those of the plurality of signal sample values, which are within the determined accepted range are used to detect whether the body is present by removing or at least reducing the effects of signal sample values, which are outside the determined accepted range of values. As a result, the effects of noise, such as square wave noise, which might otherwise cause the touch sensor to erroneously detect a body, can be substantially reduced.

Embodiments of the present invention can provide a method and apparatus for improving an accuracy with which a signal measurement is taken from a capacitively charged key, and in particular can remove or at least reduce the effects of noise, which may otherwise cause an erroneous detection of the presence of a body, when one is not present. It has been discovered that noise, for example impulsive or square wave noise having high frequency components, can cause a significant change in the value of signal samples, which are generated from a touch sensor which includes a capacitively charged key. The touch sensor determines the presence of a body from a change in the value of the signal samples which are generated from bursts of measurement cycles. Each of the measurement cycles produces a signal sample, the value of the signal sample changing if the amount of charge transferred from the key during the measurement cycle changes as a result of the presence of a body, which acts as a shunt to remove charge from the key to earth. However, noise, such as rectangular noise, can cause the value of the signal samples in a measurement burst to change, particularly when the signal sample coincides with a rising or failing edge of the rectangular noise, such as that typically generated by switching in an LCD screen.

Embodiments of the present invention provide a technique for processing the signal sample values, which are produced from a touch sensor, to the effect of reducing the effects of noise which can cause a change in the signal sample value, which can be misinterpreted as the presence of a body proximate the touch sensor of the capacitively charged key. The processing can include, for example, discarding the signal sample values which are outside the range. The accepted range may be defined by a determined maximum or determined minimum value of signal samples, which are generated for example, either periodically or during a test phase of the touch sensor, such as for example, during a power on or a start up phase.

Various further aspects and features of the present invention are defined in the appended claims.

BRIEF DESCRIPTION OF THE DRAWINGS

Example embodiments of the present invention will now be described by way of example only with reference to the accompanying drawings, in which like parts are referred to by like reference numerals and in which:

FIG. 10b is a plot of signal strength against time representing sampled measurements of the charge present on a key according to the diagram of FIG. 10a.

FIG. 12 is a schematic block diagram illustrating process elements or steps in an operation of processing the samples of the charge including the noise in order to suppress the rectangular noise shown in FIG. 10a;

DETAILED DESCRIPTION

Figure 1A:
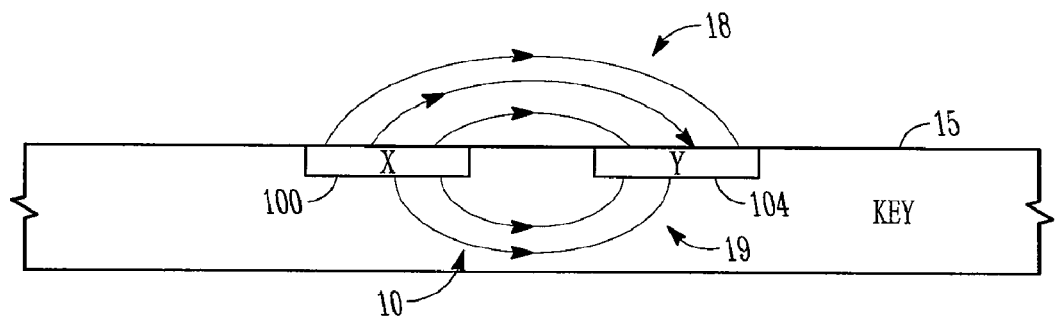
FIG. 1A is a schematic block diagram providing an example of a touch sensitive sensor.
Figure 1B:
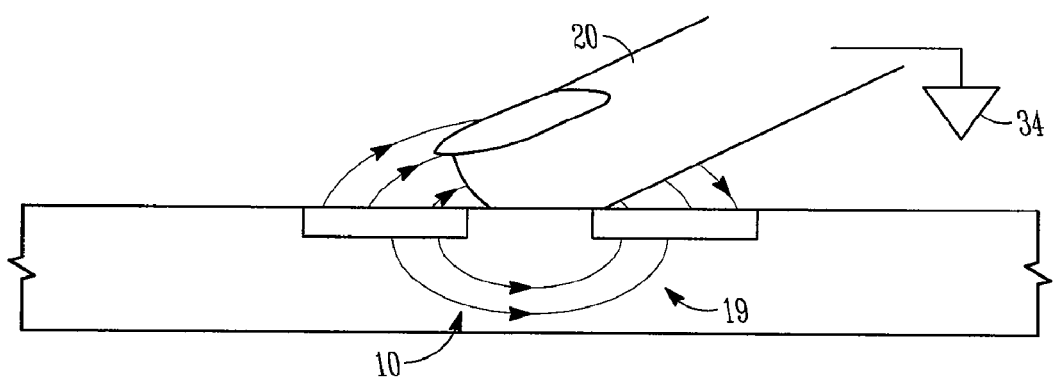
FIG. 1B is an example illustration of a user's finger disposed proximate the sensor.

As explained above there are various forms of touch sensors which can determine the presence of a body proximate the touch sensor as a result of a change of charge transferred from a key of the touch sensor. An example of such a touch sensor is shown in FIGS. 1A and 1B. The example shown in FIGS. 1A and 1B correspond to an example in which a pair of electrodes form a touch sensor. As shown in FIG. 1A a pair of electrodes 100, 104 which form a drive or X plate and a receiving or Y plate in the following description are disposed beneath the surface of a touch sensitive control panel 15. As shown in FIGS. 1A and 1B the touch sensor 10 is arranged to detect the presence of a body such as a user's finger 20 as a result of a change in an amount of charge transferred from the Y plate 104. As shown in FIG. 1A when the X plate 100 is charged or driven by a circuit, an electric field is formed which is illustrated by the lines 18 and 19 both above and below the touch panel surface 15 as a result of which charge is transferred to the Y plate 104. The X plate and the Y plate 100, 104 form a capacitively charged key 10. As shown in FIG. 1B as a result of the disturbance of the electric field 18 due to the presence of the user's finger 20 the electric field above the surface of the control panel 15 is disturbed as a result of an earthing or grounding effect provided by the user's finger 20 as illustrated schematically by ground 34.

Figure 2:
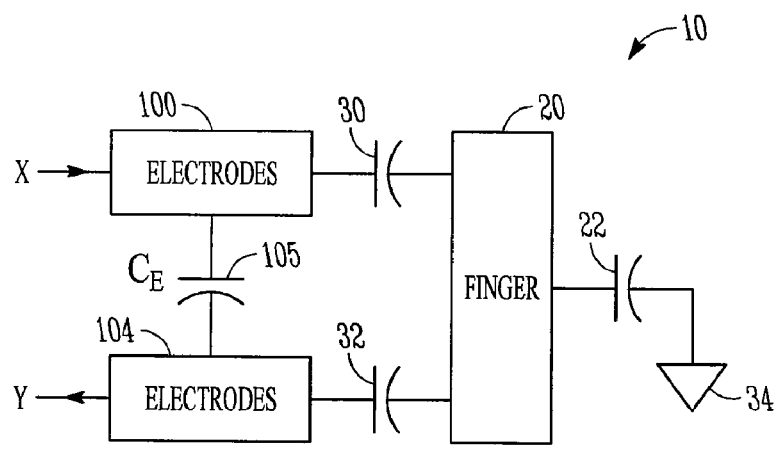
FIG. 2 is a schematic block diagram illustrating an electrical equivalent of the touch sensor shown in FIG. 1B.

An equivalent circuit diagram of the touch sensor shown in FIGS. 1A and 1B is shown in FIG. 2. In FIG. 2 equivalent capacitances are illustrated in the form of a circuit diagram. A capacitance formed between the X plate and the Y plate of the key 100, 104 is a capacitance $C_E$ 105. The presence of the body 20 has an effect of introducing shunting capacitances 30 and 32, which are then grounded via the body 20 by an equivalent grounding capacitor 22 to the ground 34. Thus the presence of the body 20 affects the amount of charge transferred from the Y plate of the key and therefore provides a way of detecting the presence of the body 20.

Figure 3:
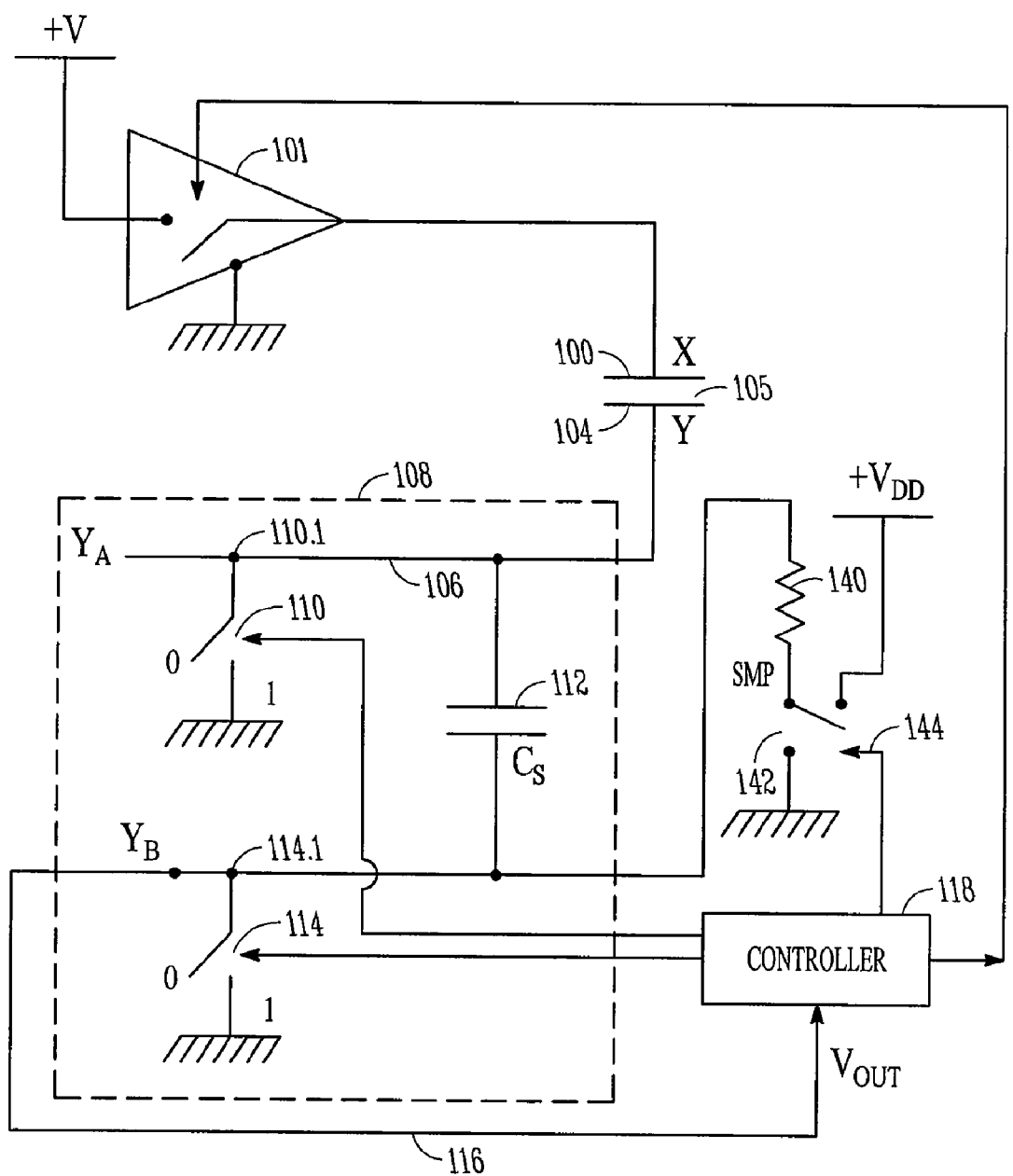
FIG. 3 is a schematic block diagram of a circuit which in combination with the touch sensor shown in FIG. 1B serves to form a touch sensor.

FIG. 3 provides an example circuit diagram which forms a touch sensor by sensing an amount of charge transferred from the X plate 100 shown in FIG. 2 to the Y plate 104 and includes a charge measurement circuit which has been reproduced from WO-00/44018 in order to assist in the illustration of example embodiments of the present invention.

As shown in FIG. 3 a drive circuit 101 is connected to the X plate of the key 100 and the Y plate of the key 104 is connected to an input 106 of a charge measurement circuit 108, wherein the X and Y plates collectively form the capacitor 105. The input 106 is connected to a first controllable switch 110 and to one side of a measuring capacitor $C_S$ 112. The other side of the measurement capacitor 112 is connected via a second switch 114 to an output 116 of the measurement circuit 108 which is fed as a voltage $V_{OUT}$ to a controller 118. In the circuit diagram shown in FIG. 3 a convention has been adopted to show that a control input of each of the switches 110, 114 is open for the control input "0" and closed for the control input "1". The other side of each of the switches 110, 114 is connected to ground, so that if the control input is "1" then the connecting input would be connected to ground. The operation of the touch sensor shown in FIG. 3 including the function of the measurement circuit which is arranged to measure an amount of charge transferred from the X plate to the Y plate of the key 104 will now be explained with reference to the timing diagram shown in FIG. 4.

Figure 4:
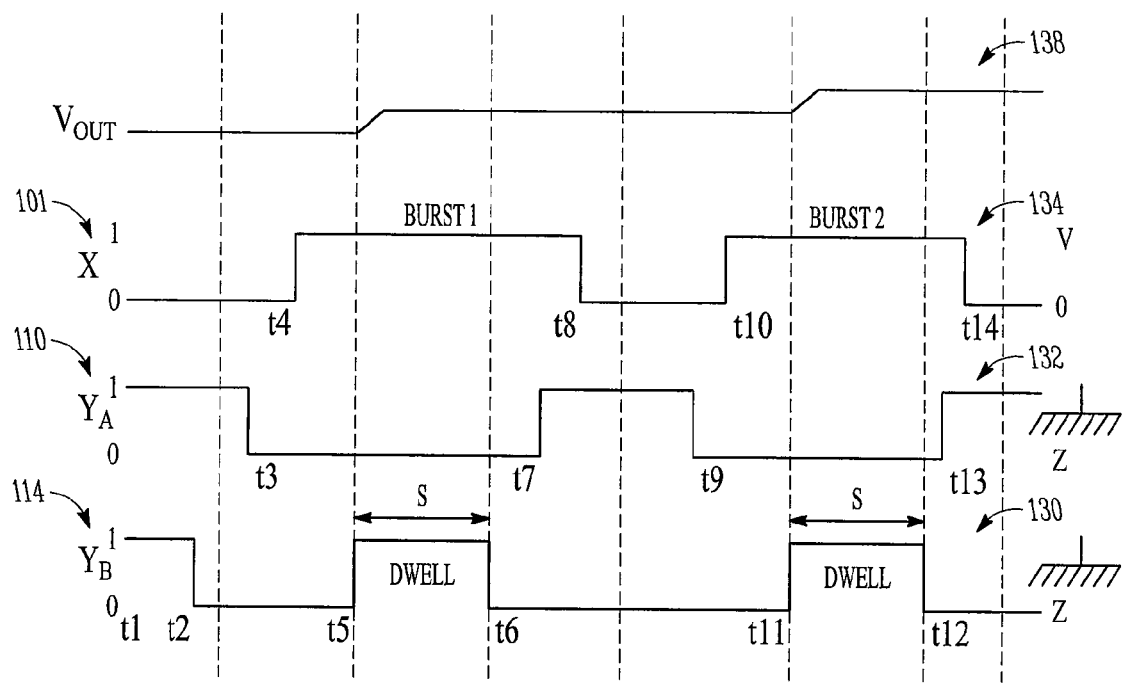
FIG. 4 is an example timing diagram illustrating the operation of the sensing circuit shown in FIG. 3.

In FIG. 4, four timing diagrams 130, 132, 134, 138 are shown to illustrate the operation of the measurement circuit 108 shown in FIG. 3. A first timing diagram 130 represents the control input applied to the second switch 114. Thus, on the left hand side, the logical value of the control input is shown, whereas on the right hand side the effect at the connecting point 114.1 is shown to be either "Z" in which the connecting point 114.1 is isolated or floating, or for a logical control input of 1 grounded. Similarly a timing diagram 132 illustrates for logical control input values "0" or "1" of a connecting point 110.1 at either floating (Z) or ground (0). A third timing diagram 134 shows a relative timing of a drive signal provided to the X plate 100 of the key in which case, in contrast to the timing diagrams 130, 132 for the two switches 110, 114, the value of the timing diagram is an absolute value so that the left hand side illustrates that the voltage varies between 0V and the reference voltage, which is the voltage used to charge the X plate 100. The final timing diagram 138 provides an illustration of the example signal strength or voltage produced on the measurement capacitor 112 as a result of the opening and closing of the switches 110, 114 and the driving of the X plate 100 in accordance with the timing illustrated by the timing diagrams 130, 132, 134. The timing diagrams 130, 132, 134, 138 will now be explained as follows:

In FIG. 4 at a first point t1, the charge measurement circuit 108 is initialised with both the control inputs for the switches 110, 114 being high (1) so that both the Y plate and the charge measurement capacitor 112 are set to ground and the X plate 100 of the key is at zero and therefore not being driven by the drive circuit 101. Correspondingly, the output voltage across the charge measurement circuit 112 is at zero. At t2 the logical input to the control switch 114 is set to zero thereby opening the switch and floating the connecting point 114.1, which connects the output voltage 116 to one side of the measurement capacitor 112.

At a next time t3 the control input to the switch 110 is set low (0) thereby floating the connecting point 110.1 which is $Y_A$ before at a time t4 the drive circuit 101 drives the X plate of the key 100 to the reference voltage V. Then in order to charge the measurement capacitor $C_S$ for a period S between t5 and t6, the control input to the switch 114 is set high (1) thereby grounding $Y_B$ to transfer charge induced on the Y plate of the key 104 onto the charge measurement capacitor 112, until t6 when the control input to the switch 114 is set to low (0), which again floats the connecting point 114.1. After charging the measurement capacitor $C_S$ for a first dwell time between t5 and t6, at t7 the control input to switch 110 is set high (1), thereby grounding the connecting point 110.1, which is connected to the other side of the charge measurement capacitor $C_S$ 112. As a result, the voltage across the measurement capacitor can be measured. The amount of charge transferred from the Y plate 104 onto the measurement capacitor $C_S$ 112 during the dwell time between t5 and t6 is represented as the output voltage $V_{OUT}$.

At t8 the drive circuit 101 goes low (0), which concludes a first measurement burst.

At t9 the next measurement cycle of a measurement burst occurs. At t9 the control input to the switch 110 goes low (0) thereby floating $Y_A$, before the drive circuit again drives the X plate 100 with a voltage "V", at time t 10. The measurement capacitor 112 is again charged from charge transferred from the Y plate 104 of the key onto the measurement capacitor 112. As with the first burst at point t11 the control input to the switch 114 goes high (1) thereby grounding the point 114.1 and driving charge onto the measurement capacitor until t12, when the control input to the switch 114 goes low, again floating $Y_B$. Thus again charge is transferred from the Y plate 104 during the dwell period between t11 and t12, thereby increasing the voltage across the measurement capacitor $C_S$ as represented as the output voltage $V_{OUT}$. At t13 the control input to the switch 110 is set high (1) thereby grounding $Y_A$ and at t14 the drive circuit 101 goes low (0), which concludes the second measurement burst. Thus, as with the first burst an amount of charge has been transferred from the Y plate, which has then increased the voltage across the measurement capacitor 112, which represents an amount of charge transferred from the Y plate.

After several bursts the amount of charge present on the Y plate transferred to the measurement capacitor 112 is consistent, thereby providing a representation of charge present on the key produced by the drive signal to the X plate 100 via the drive circuit 101. The amount of charge on the measurement capacitor 112 is determined with the aide of a discharge resistor 140. One side of the discharge resistor 140 is connected to the measurement capacitor and the other side SMP is connected to a discharge switch 142. The discharge switch 142 receives a control signal from the controller 118 via a control channel 144. The controller 118 is controlled so as to ground SMP, during measurement bursts and to discharge the measurement capacitor $C_S$ 112 through the discharge resistor 140 by connecting SMP to a voltage $V_{DD}$. The controller 118 then determines an amount of charge present by counting a number of predetermined clock periods before the charge on the measurement capacitor $C_S$ is discharged to zero. The number of clock periods therefore provides a relative signal sample value for the respective measured charge signal.

In alternative embodiments, instead of arranging for the controller 118 to generate a predetermined number of measurement bursts and then measuring the charge present on the Y plate, the controller may operate to continue with the measurement bursts until a predetermined threshold voltage is reached. The number of measurement bursts required to reach the predetermined threshold then provides an indication of the amount of charge transferred from the X plate to the Y plate and therefore an indication of the electric coupling between them. Hence the presence of a body proximate the coupling will change the electric coupling and therefore the number of bursts required to reach the threshold, which can therefore be detected by the controller.

As explained in WO-00/44018 a charge subtraction capacitor is provided to subtract charge from the Y plate of the key 104 and the measurement capacitor to ensure that there is a linear transfer of charge onto the measurement capacitor 112 to provide an accurate measurement. Further explanation is therefore provided in WO-00/44018 the content of which is incorporated herein by reference.

One advantage of the measurement circuit shown in FIG. 3 is that, using the same principles of construction and operation, a matrix of touch sensitive switches can be formed, so that a user can select either a plurality of different positions on a touch sensitive screen, for example, or a plurality of different functions in dependence upon the position of the user's finger for example with respect to the matrix of points. For example, FIG. 5 has been largely reproduced from WO-00/44018.

Figure 5:
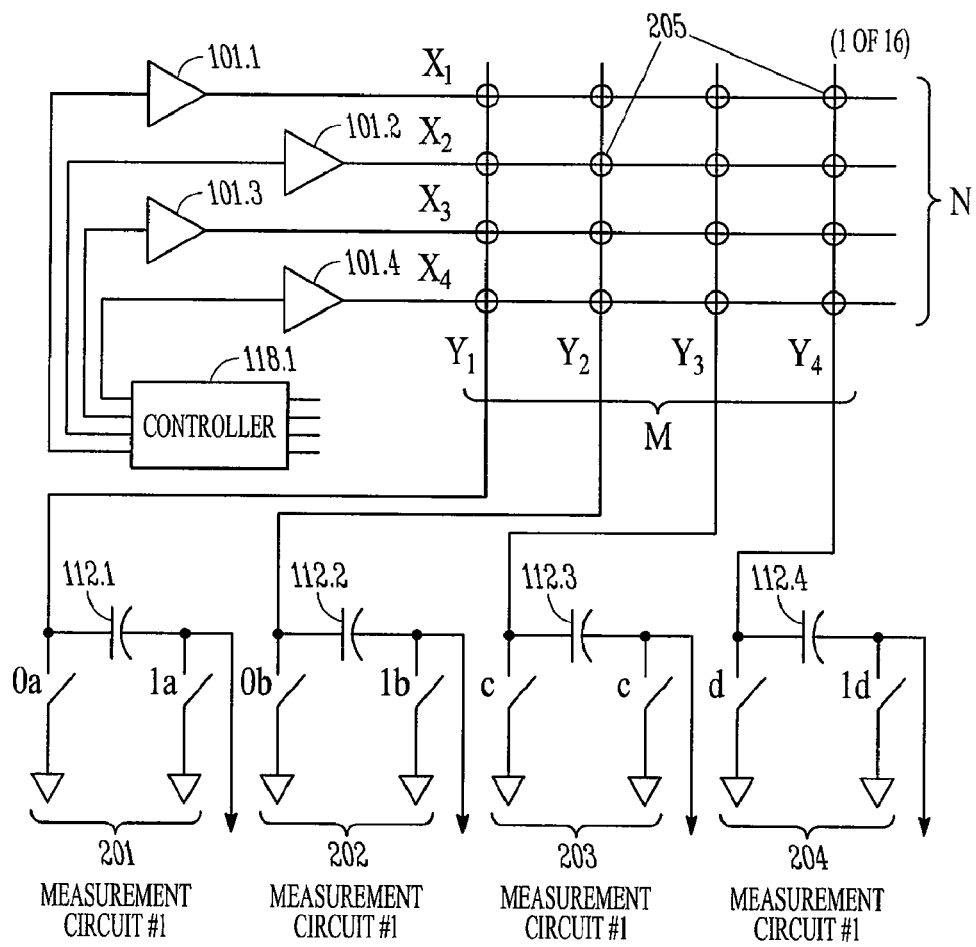
FIG. 5 is a schematic block diagram illustrating a touch sensitive matrix providing a two-dimensional capacitive transducing sensor arrangement.
Figure 6:
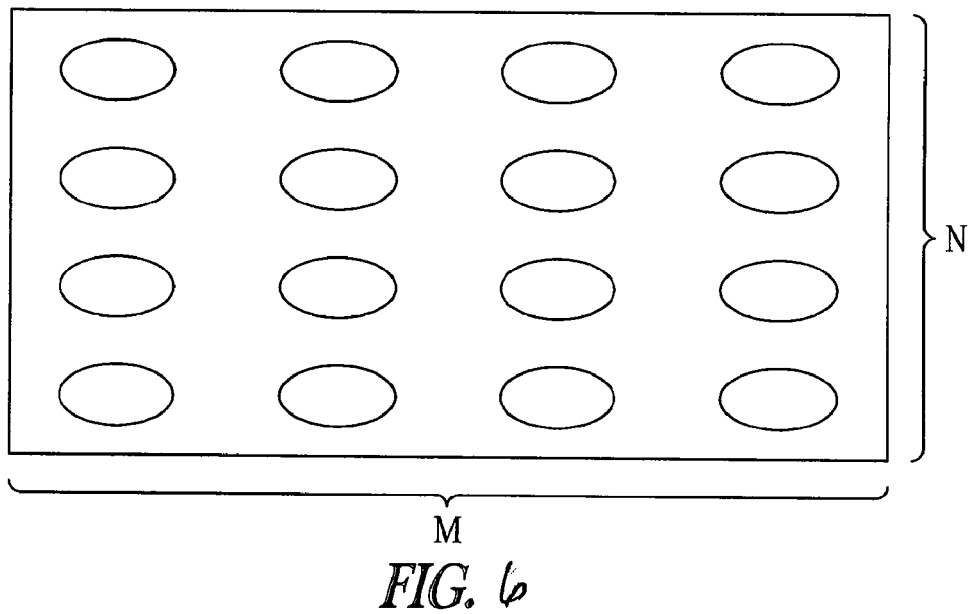
FIG. 6 is a schematic illustration showing an application of the two-dimensional capacitive transducing sensor shown in FIG. 5.

In FIG. 5 drive circuits 101.1, 101.2, 101.3, 101.4 are arranged to drive different sensor points 205 which with example shown in FIG. 5 forms an N=4×M=4 array. Thus, as shown correspondingly in FIG. 6 a control panel with sixteen touch sensitive points is provided which can be used to either form the touch sensitive screen or a control panel with multiple selection control switches.

As shown in FIG. 5 each of the drive circuits 101.1, 101.2, 101.3, 101.4 is controlled by controller 118.1 to drive each of the corresponding lines X1, X2, X3, X4 in the same way as the X plate 100 is driven in FIG. 3 and represented in FIG. 4. The output of the coupling capacitor at each of the points 205 are connected to one side of measuring capacitors 112.1, 112.2, 112.3, 112.4 which are arranged to measure an amount of charge present on the Y plate Y1, Y2, Y3, Y4 providing output signals 116.1, 116.2, 116.3, 116.4 to detect the presence of an object in the same way as the operation of the circuit shown in FIG. 3 and FIG. 4. More details for the operation of such a matrix circuit are disclosed in WO-00/44018.

Although the touch sensor described above with reference to FIGS. 1 to 6 provides an effective touch sensor which can be used for many applications, there is a desire to use such touch sensors in increasingly challenging environments. For example, the use of a touch sensor on a mobile phone can create a technical problem because there is a variety of disturbing noise signals produced by radio frequency radiation by radio frequency signals and by modulators within the mobile phone. Similarly, on a television, switching noise as a result of switching LCD displays and pixels within the display on and off can produce rectangular noise. Sinusoidal noise, such as that produced by mains electricity may also be present, which can affect the amount of charge detected on a key. An example of sinusoidal noise is shown in FIG. 7.

Figure 7:
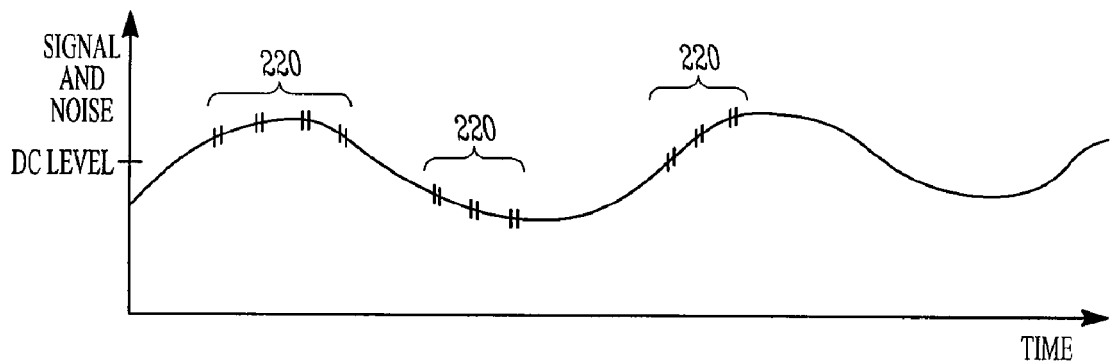
FIG. 7 is a graphical illustration showing a plot of signal strength with respect to time representing a voltage or charge present on a sensing key which has been affected by sinusoidal noise, such as mains noise.

In FIG. 7 a plot is shown of signal strength or amplitude which may be voltage or charge measured with respect to time. As shown in FIG. 7 various points 220 are shown to indicate points at which burst measurements are taken for a touch sensor such as those shown in FIGS. 4 and 5. As will be appreciated, as a result of sinusoidal noise represented by a line 222, an amount of charge transferred from a key by a measurement capacitor of the measurement circuit such as those shown in FIGS. 3 and 5 will vary and therefore could in some circumstances cause a false measurement of the presence of a body.

Figure 8:
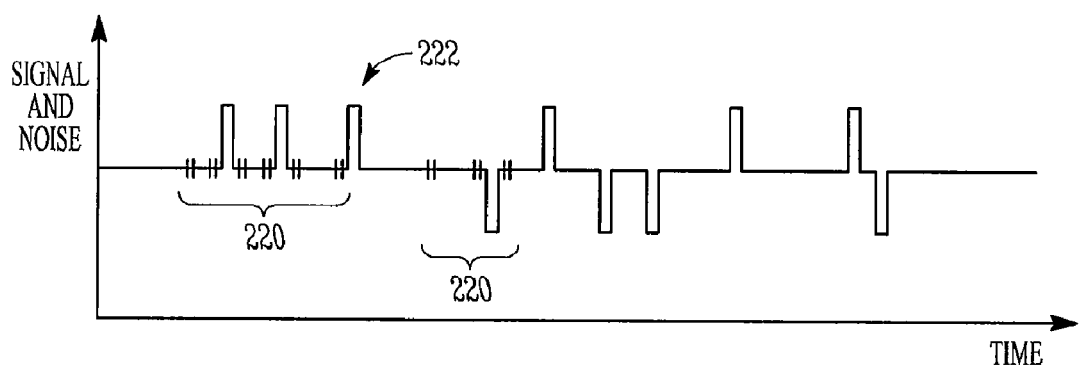
FIG. 8 is a graphical illustration of a plot of signal strength with respect to time representing the voltage or charge on a sensing key in the presence of rectangular noise.
Figure 9:
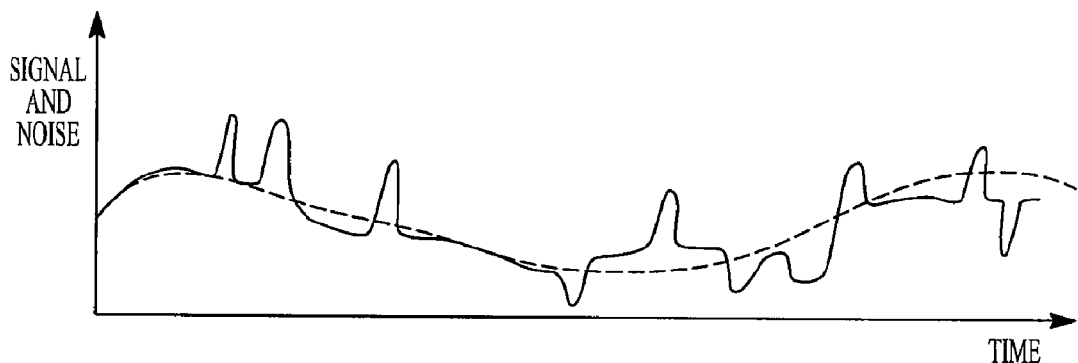
FIG. 9 is a graphical representation of signal strength with respect to time for a combination of the sinusoidal shown in FIG. 7 and the rectangular noise shown in FIG. 8.

Similarly, a result of rectangular noise, having high frequency components, such as that which might be produced by switching the pixels in a LCD display is shown in FIG. 8. Again, a plot is shown of signal strength with respect to time with sampling points 220, which might be produced by bursts of measurement cycles in a measurement circuit such as those shown in FIGS. 3 and 5. Again, in FIG. 8 measurement points 222 which correspond to bursting of a measurement circuit and keys in a touch sensor are shown. As will be explained shortly, if a measurement cycle coincides with a rising edge of a rectangular noise which is typically produced and illustrated by the plot shown in FIG. 8 by LCD switching noise, then an erroneous measurement can be produced which can again cause a touch sensor to erroneously detect the presence of a body. As will be explained shortly, embodiments of the present invention can provide a technique, which can ameliorate a deleterious effect caused by this rectangular noise. As will be appreciated however, in some examples, both sinusoidal noise and rectangular noise can be present so that the plot of signal amplitude with respect to time for a combination of sinusoidal noise shown in FIG. 7 and rectangular noise shown in FIG. 8 is as shown in FIG. 9. A technique for reducing the effects of sinusoidal noise is disclosed in our co-pending U.S. application Ser. No. 12/466,192.

A technique for reducing the effects of rectangular noise will now be described, which can provide an improved likelihood of correctly detecting the presence of a body. As will be appreciated, this technique can be combined with the technique for reducing the effects of sinusoidal noise disclosed in the aforementioned US application, to make a further improvement in the likelihood of correctly detecting a body in the presence of sinusoidal and higher frequency noise.

Processing to Reduce Noise

As mentioned above the present technique can provide an arrangement for reducing the effects of noise, for example impulsive or rectangular noise. As explained with reference to the example measurement circuits shown in FIGS. 1 to 6, which employ a micro-controller to perform a burst measurement cycle to transfer charge in discrete time intervals from a key, noise of some types can disrupt these measurements.

Figure 10A:
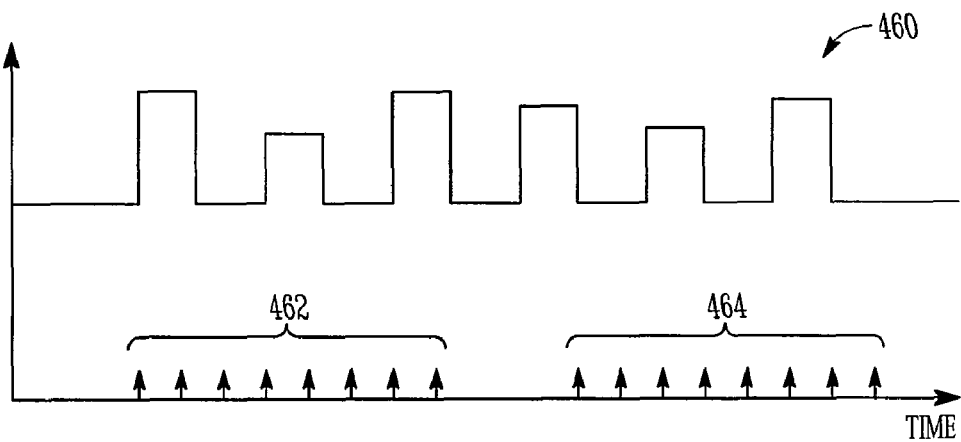
FIG. 10a is a graphical representation of a plot signal strength with respect to time in which rectangular noise is superimposed on the measured signal.

FIG. 10a shows an example of rectangular noise with respect to time 460, wherein the noise occurs during a series of sampling points within two bursts of measurement cycles 462, 464. Each measurement cycle 462, 464 produces a set of signal sample values, which are representative points in time where measurements are taken of charge induced on a key by a measurement circuit, such as for example those described above. However, the rectangular noise can disrupt the measurements as explained above, if for example a measurement cycle corresponds to a rising or falling edge of the rectangular noise 466.

Figure 10B:
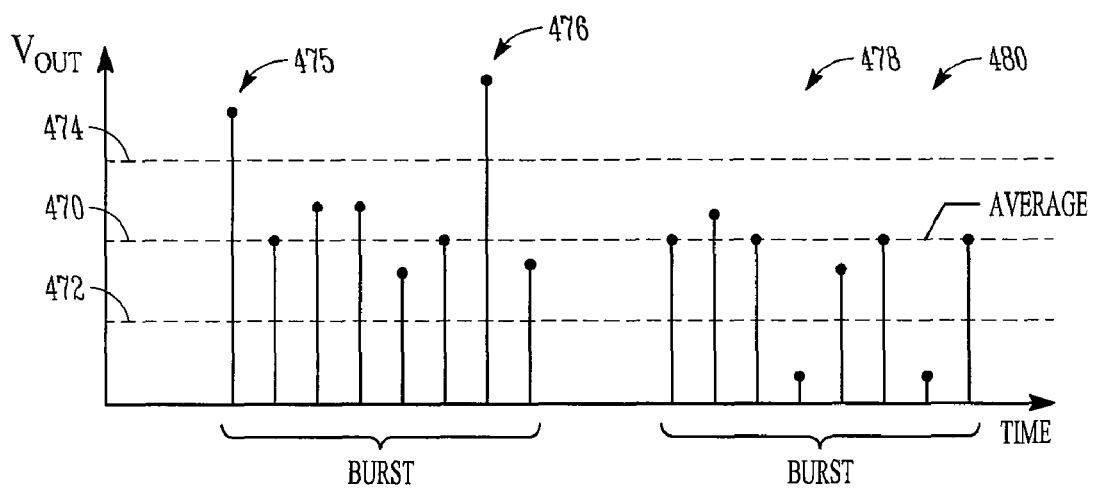
Figure 10C:
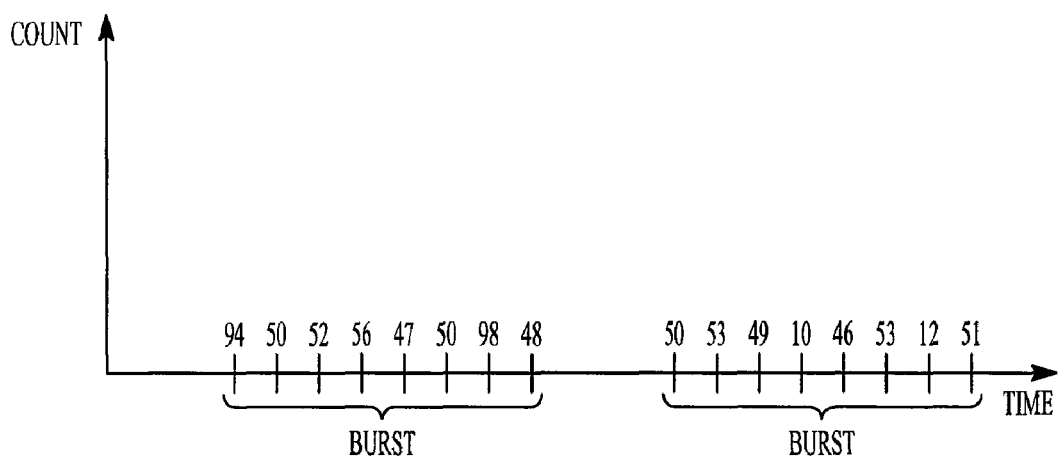
FIG. 10c is an illustration of the relative value of the each of the samples shown in FIG. 10b with respect to time.
Figure 11:
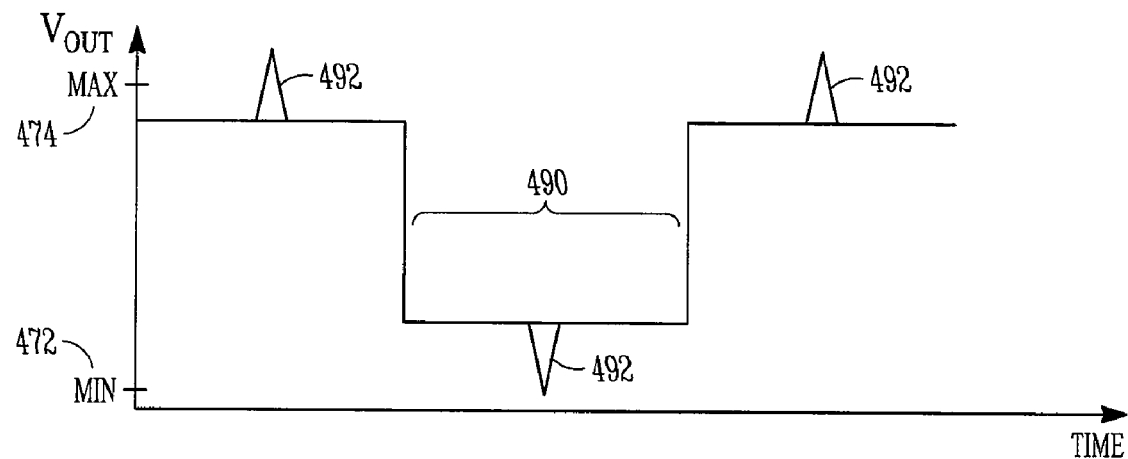
FIG. 11 is a graphical representation of a plot of signal value with respect to time for an example in which a body has been move to be proximate a sensing key for a period of time.

For the example bursts 462, 464 shown in FIG. 10a, FIG. 10b illustrates a value of charge measurements for each of these points with respect to time, with a corresponding representation as a numerical count value being shown in FIG. 10c. As can be seen, the average value of the charge detected is shown on a line 470, and above and below the average 470, pre-determined minimum and maximum signal samples 472, 474, are set in accordance with an expected range of sample values during the operation of the touch sensor. For example, as shown in FIG. 11 a graphical plot of signal sample values is shown, which includes a period 490 which corresponds to a time when a body is present proximate the charge sensor. As can be seen, the pre-determined minimum and maximum values 472, 474 are arranged so that the normally expected average signal value is between the minimum and maximum values 472, 474 and the value of the signal when a touch is detected is greater than the minimum value 472. The average may be the mean, median or any other numerical average. As will now be explained signal spikes 492 may also be present as a result of rectangular noise.

As can be seen at time points 475, 476, 478, 480, in FIGS. 10a, 10b, 10c, where a measurement cycle coincides with a rising or falling edge from a square wave of the noise 460, erroneous values are measured which exceed 474, 476 or are lower than 478, 480 (the accepted range of sample values within which charge measurements should lie). As a result, these measurement values 474, 476, 478, 480 can give rise to an erroneous detection of a body proximate the sensor.

The samples shown in FIG. 10*b* are represented as corresponding relative values in FIG. 10*c*, which can be referred to as count values, because, as explained for the touch sensor shown in FIG. 3, the measurement taken corresponds to the number of time-increments required to discharge the measurement capacitor through a measurement resistor.

Figure 12:
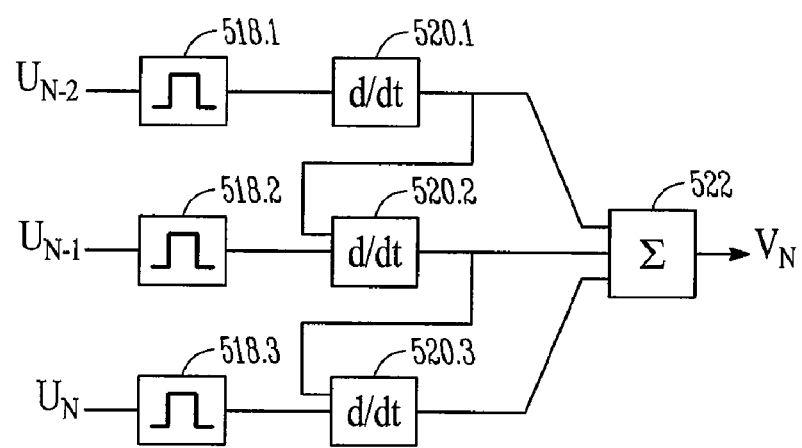

Embodiments of the present technique provide an arrangement for reducing the effects of noise, which can produce erroneous samples of charge measurement from a touch sensor. FIG. 12 provides a block diagram of elements involved in reducing the effects of the rectangular noise. However, it will be appreciated that the present technique processes the signal sample values produced from a charge measurement circuit within for example a micro-controller and therefore the elements shown in FIG. 12 could in fact form part of the micro-controller 118 of FIG. 3.

In FIG. 12 the samples $U_n$, $U_{n-1}$, $U_{n-2}$ are first received by a band pass filter 518.1, 518.2, 518.3 after which they are processed respectively by a slew rate limiter 520.1, 520.2, 520.3 and then the output of the slew rate limiters 520.1, 520.2, 520.3 are fed to an averaging filter 522. The slew rate limiters are cascaded to the effect that the output from the first slew rate limiter 520.1 is provided as an input to the second slew rate limiter 520.2 and the output of the second slew rate limiter is fed as an input to the third slew rate limiter 520.3. The processing of each of the samples $U_n$, $U_{n-1}$, $U_{n-2}$ by the band pass filters 518.1, 518.2, 518.3, the slew rate limiters 520.1, 520.2, 520.3, and the averaging filter 522 to produced the output signal sample $V_n$ are represented effectively by the graphical plots with respect to time shown in FIGS. 13*a*, 13*b* and 13*c*.

When the samples are received by the band pass filters 518.1, 518.2, 518.3 the signal sample values are compared to the accepted range 472, 474 and are discarded if they fall outside the range of values.

As can be seen for the example shown in FIG. 13*a*, at the points 475, 476 the values which exceeded the maximum value 474 and at the points 478, 480 the samples which were below the minimum value 472 are re-sampled until there values are within range.

The signal samples are then received by the slew rate limiters 520.1, 520.2, 520.3, which use past the samples values $U_{n-1}$, $U_{n-2}$ as well as the present sample value $U_n$ to maintain an accumulated relative average value, which should be maintained around the average 470. The rate at which the input value is allowed to change is adapted in accordance with the relative change between samples. There are various possible implementations for the slew rate limiters 520.1, 520.2, 520.3. It will be appreciated that various techniques could be used to limit the rate of change from one sample to the next. Such a limit could be a linear change, or where two samples exceed a predetermined value, the rate of change can be capped to a fixed increment or decrement so that the slew rate limiter can settle on the average value more quickly. A control input 524 can be provided to adapt the rate of change provided by the slew rate limiter.

From the output of the slew rate limiters 520.1, 520.2, 520.3 the samples are fed to the averaging filter, which performs an averaging of the samples received from each of the slew rate limiters 520.1, 520.2, 520.3. As a result of the processing techniques performed by the micro-controller, the measurement circuit reduces the effect of signal samples, which coincide with impulses of noises or rising or falling edges of noise and therefore cause the values to exceed or fall below an expected range of values. Therefore a more reliable indication that a body is present can be made rather than these noise-induced values causing the touch sensor to be triggered.

Setting the Accepted Value Range

Figure 13A:
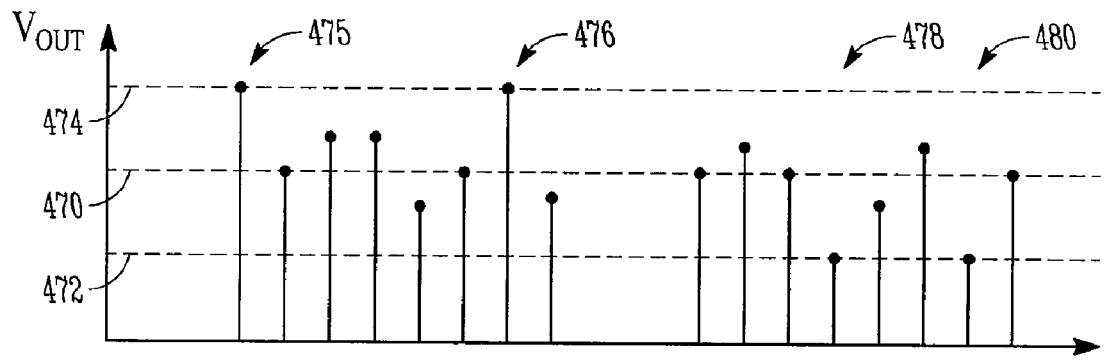
FIG. 13a is a graphical representation of an effect of processing the samples of the charge with respect to time shown in FIG. 10b by band pass filtering.
Figure 13B:
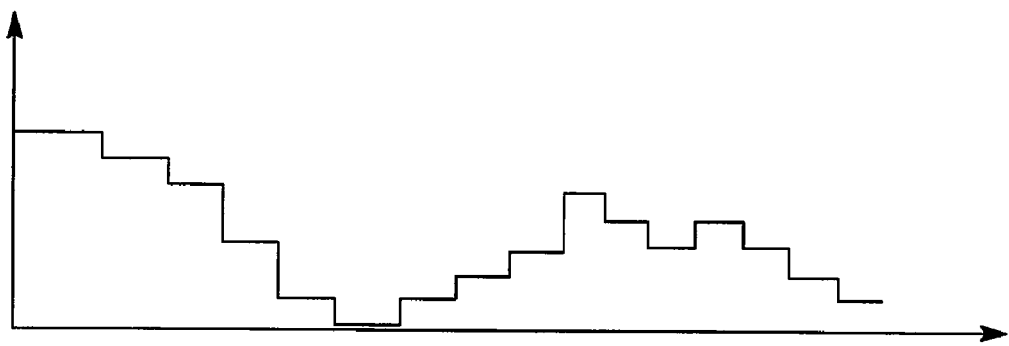
FIG. 13b is a graphical representation of a plot of signal amplitude with respect to time resulting from the processing performed by a slew rate limiter shown in FIG. 12.
Figure 13C:
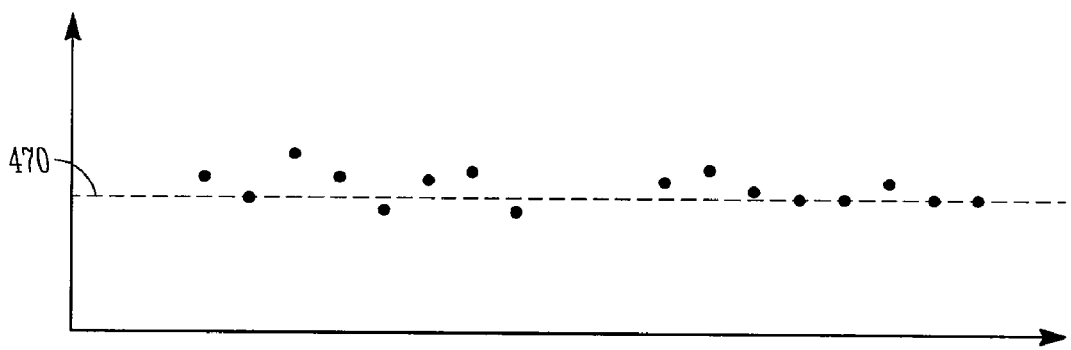
FIG. 13c is a graphical representation of the values of the measured charge produced by averaging the samples of the charge by the process shown in FIG. 12.

According to one example of the present technique, the accepted range of signal sample values, which are defined by the maximum and minimum values 472, 474 shown in FIGS. 10*b* and 13*a*, are set during a test phase of the touch sensor. In one example, the test phase is during power up. During the test phase, a set of bursts of measurement cycles is performed, to generate for each measurement cycle a signal sample value. The maximum and minimum values of the signal samples taken during the initialisation phase are used to define the accepted range of signal sample values. The accepted range defines the predetermined maximum and minimum values, which are applied to limit the subsequent signal sample values.

In one example, a mean value of the signal sample values, which are generated during the initialisation phase, is determined based on the assumptions that there is no touch during this phase. The maximum and minimum values of the accepted range are then calculated with reference to this mean value. For example, a pre-determined fraction of this mean value is calculated and this is added to the mean value to determine the maximum value and subtracted from the mean value to produce the minimum value of the accepted range. During quiet periods for instance, the calibration process can be automatically repeated, or can be repeated regularly or irregularly according to some deterministic schedule. Thus the initialisation phase could be controlled and initiated by the micro-controller 118 to calculate the accepted range of values to calibrate the touch sensor. Alternatively, the initialisation phase could initiated by the user to calibrate the device.

Summary of Operation

Figure 14A:
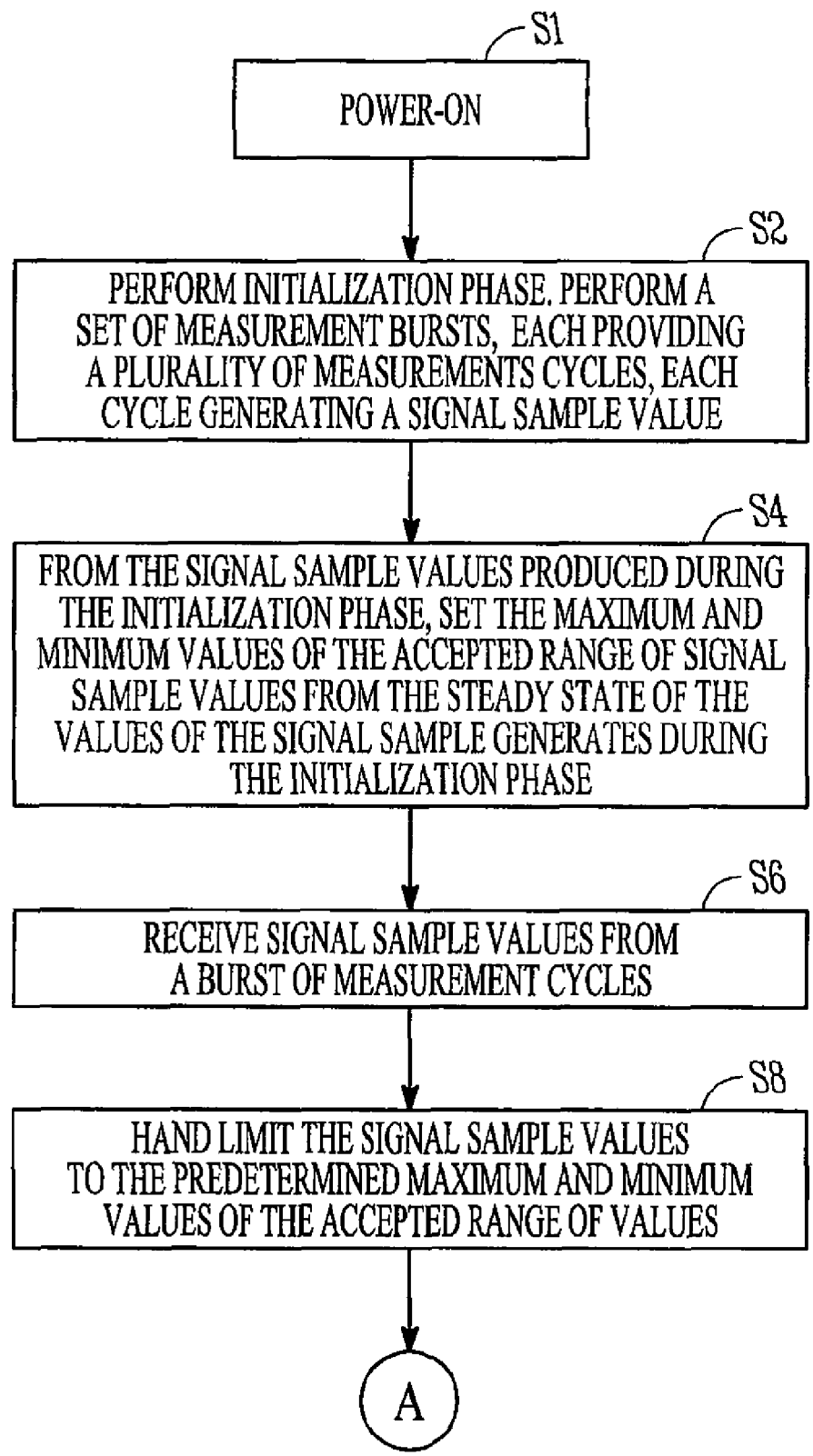
FIGS. 14a and 14b provide an example flow diagram illustrating the operation of the touch sensor according to the present technique.
Figure 14B:
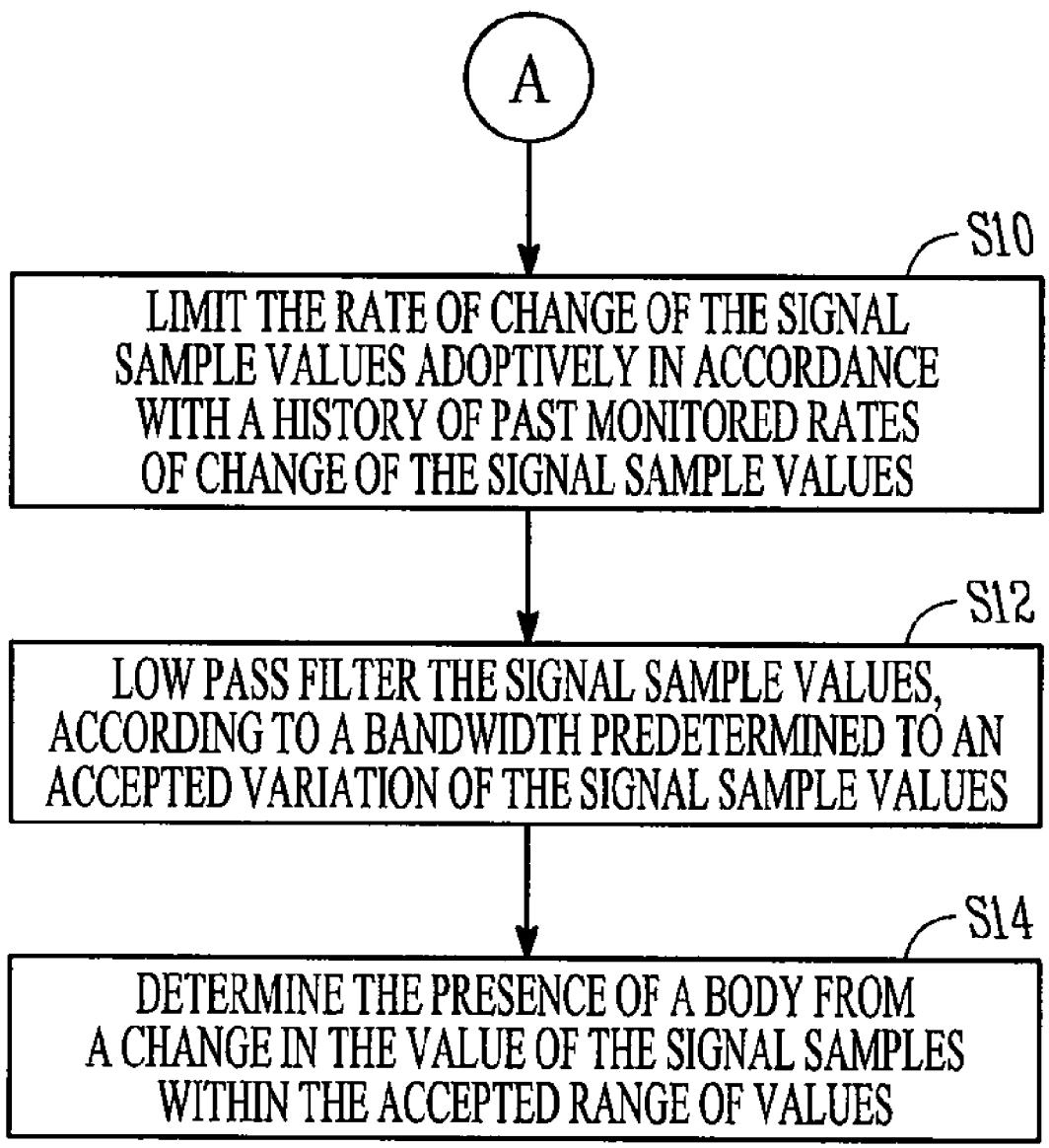
Figure 15:
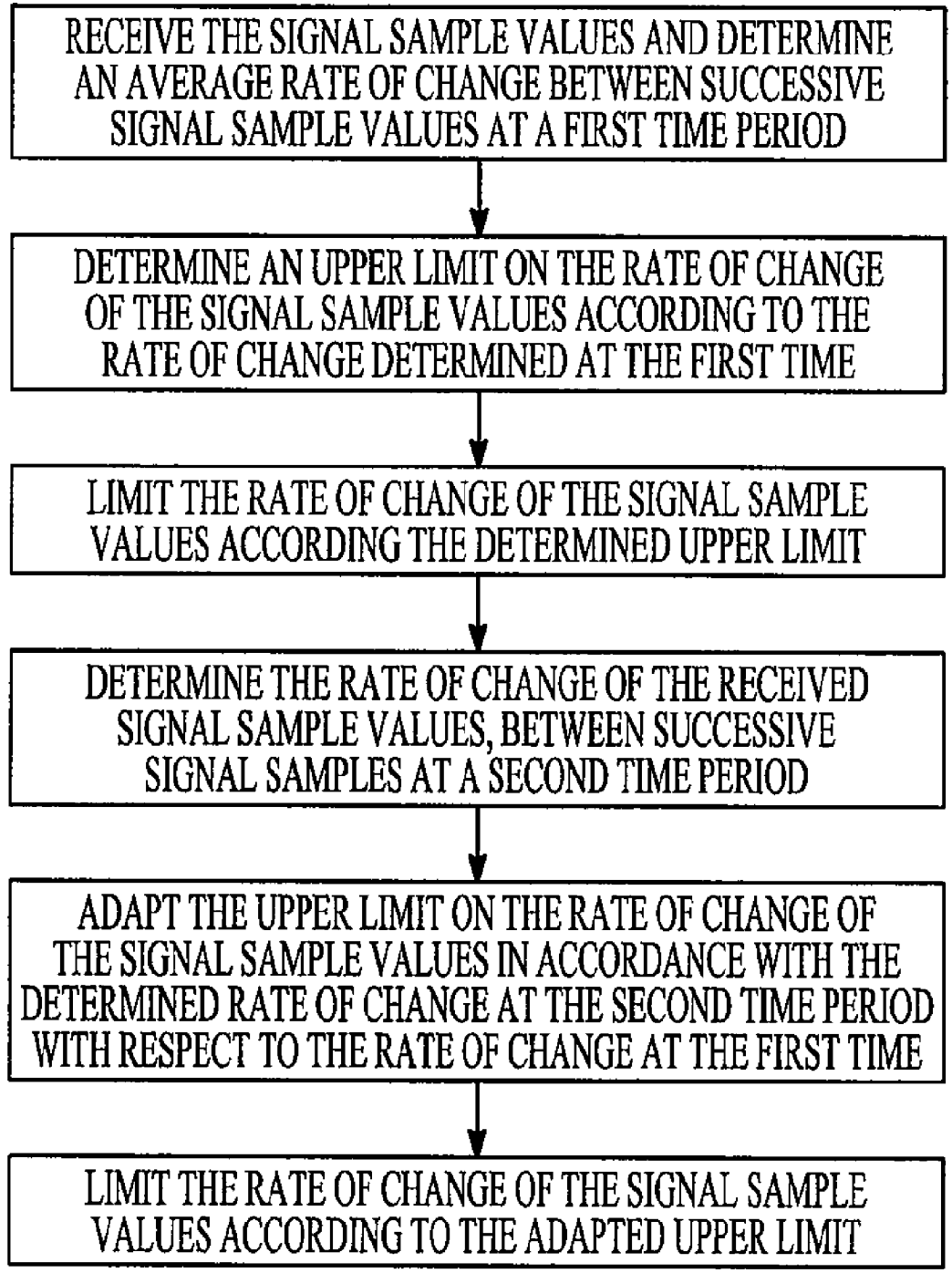
FIG. 15 is a flow diagram illustrating one example of a process for adapting the rate of change or slew rate of the signal sample values as performed by the processing technique illustrated in FIGS. 14a and 14b.

The operation of a touch sensor according to the present technique which includes processing signal sample values to reduce the effects of noise with high frequency components is summarised in the flow diagram shown in FIGS. 14*a*, 14*b* and 15. The process steps of the method illustrated by the flow diagram shown in FIG. 13*a* are summarised as follows:

S1: A test phase begins, for example, after power has been supplied to the touch sensor.

S2: A test phase starts with the controller performing a series of measurement bursts to calibrate the touch sensor to establish an accepted range of values. Each of the measurement bursts is comprised of a plurality of measurement cycles, each cycle generating a signal sample value from the touch sensor. Thus it is assumed at this time that there is no body present, which would otherwise be associated with the sensor being triggered.

S4: The controller then analyses the signal sample values and determines from the signal sample values a steady state or mean value of the signal sample values. The maximum and minimum value of the accepted range of values is then determined with reference to this mean value by adding and subtracting a fraction of the value to itself to form the maximum and minimum values respectively.

S6: After step S4, the initialisation phase is complete and the processing of the signal sample values, which are generated from bursts of measurement cycles, to detect the presence or absence of a body proximate the touch sensor. The signal sample values are received by the controller.

S8: The processing of the signal sample values begins by band pass filtering the signal sample values which lie outside of the accepted range. This can be done by setting values above the maximum to the maximum and values below the minimum to the minimum. Alternatively, any value outside the accepted range can be discarded.

The method of operation of the touch sensor then continues via connecting elements A to step S10 shown in FIG. 14b.

S10: The slew rate or rate of change of the signal sample values is then limited to be within a determined range. Furthermore, in some examples, the slew rate limit is adapted in accordance with a continuously monitored rate of change of the signal sample values. For example, the slew rate limit can be adapted in accordance with the technique illustrated by the flow diagram shown in FIG. 15 and explained as follows:

S10.2 Determine the rate of change between the value of the successively received signal sample values at a first time period.

S10.4: Determine an upper limit on the rate of change of the signal sample values, which can be allowed, in accordance with the determined rate of change at the first time.

S10.6 Limit the rate of change of the signal sample values in accordance with the determined upper limit.

S10.8 Determine a rate of change between the value of the successive signal sample values at a second time after the first time.

S10.10 Adapt the upper limit on the rate of change of the signal sample values in accordance with the rate of change at the second time with respect to the rate of change at the first time.

S10.12 Limit the rate of change of the signal sample values in accordance with the adapted upper limit.

Referring back to the flow diagram shown in FIG. 14b, processing continues after the slew rate limiting in step S10, with step S12:

S12: The slew rate limited signal sample values are then fed to an averaging filter, which averages the signal samples values.

S14: The process continues by the controller determining from a change in the signal sample values within the accepted range, whether or not there is a body proximate the sensor.

Further aspects and features of the present invention are defined in the appended claims. Various modifications may be made to the example embodiments described above without departing from the scope of the present invention. In particular, although the above description has been made with reference to a matrix touch sensor which includes a key having an X plate and a Y plate where the X plate is driven and charge is measured on the Y plate, the present invention also finds application where only a single plate is provided in the touch sensor which is first charged in a charge cycle and then discharged in a measurement cycle such as that disclosed in WO-97/23738.

It will be understood that the range limits do not have to be set at equal offsets from the average. For example, the lower limit could be set having regard to the noise floor as well as or instead of having regard to the average.

The invention claimed is:

1. A method, comprising:
 generating a plurality of signal sample values from a plurality of measurement cycles, each of the measurement cycles comprising:
  inducing charge onto a capacitive key;
  measuring the charge induced on the capacitive key; and
  generating a signal sample value representing the charge measured from the capacitive key; and
 processing the plurality of signal sample values to obtain a plurality of processed signal sample values, the processing comprising limiting a rate of change between a first processed signal sample value and a second processed signal sample value to a maximum rate of change;
 wherein limiting the rate of change between the first processed signal sample value and the second processed signal sample value to a maximum rate of change comprises determining a rate of change between the second processed signal sample value and a first signal sample value.

2. The method of claim 1, wherein processing the plurality of signal sample values to obtain a plurality of processed signal sample values further comprises discarding signal sample values which are outside an accepted range between a determined minimum and a determined maximum.

3. The method of claim 1, further comprising adaptively determining the maximum rate of change based on a rate of change between a first signal sample value and a second signal sample value.

4. The method of claim 1, further comprising determining the maximum rate of change based on the plurality of signal sample values, the determination comprising:
 determining, during a first time period, the maximum rate of change based on a rate of change between a first signal sample value and a second signal sample value; and
 adapting, during a second time period, the maximum rate of change based on a rate of change between a third signal sample value and a fourth signal sample value.

5. The method of claim 1, further comprising generating an output signal sample value based on an average of the first processed signal sample value and the second processed signal sample value.

6. The method of claim 1, wherein limiting a rate of change between a first processed signal sample value and a second processed signal sample value to a maximum rate of change comprises determining whether to constrain the rate of change between the first processed signal sample value and the second processed signal sample value to the maximum rate of change.

7. The method of claim 1, wherein processing the plurality of signal sample values to obtain a plurality of processed signal sample values further comprises:
 reducing, prior to limiting the rate of change between the first processed signal sample value and the second processed signal sample value to the maximum rate of change, the first processed signal sample value to a determined maximum if the first processed signal sample value exceeds the determined maximum; and
 increasing, prior to limiting the rate of change between the first processed signal sample value and the second processed signal sample value to the maximum rate of change, the first processed signal sample value to a determined minimum if the first processed signal sample value is lower than the determined minimum.

8. The method of claim 7, wherein one or more of the plurality of signal sample values are generated during a test phase, and further comprising setting the determined maximum and the determined minimum based on the one or more signal sample values generated during the test phase.

9. An apparatus, comprising:
 a driving circuit operable to induce charge onto a capacitive key;
 a charge sensing circuit comprising a signal measurement capacitor; and
 a controller, the controller being operable to perform operations comprising:
  controlling the driving circuit and the charge sensing circuit to generate a plurality of signal sample values from a plurality of measurement cycles, each of the measurement cycles comprising:
    inducing charge onto the capacitive key;
    measuring the charge induced on the capacitive key; and
    generating a signal sample value representing the charge measured from the capacitive key; and
processing the plurality of signal sample values to obtain a plurality of processed signal sample values, the processing comprising limiting a rate of change between a first processed signal sample value and a second processed signal sample value to a maximum rate of change;
wherein limiting the rate of change between the first processed signal sample value and the second processed signal sample value to a maximum rate of change comprises determining a rate of change between the second processed signal sample value and a first signal sample value.

10. The apparatus of claim 9, wherein processing the plurality of signal sample values to obtain a plurality of processed signal sample values further comprises discarding those of the plurality of signal sample values which are outside an accepted range between a determined minimum and a determined maximum.

11. The apparatus of claim 9, wherein the controller is operable to perform operations further comprising adaptively determining the maximum rate of change based on a rate of change between a first signal sample value and a second signal sample value.

12. The apparatus of claim 9, wherein the controller is operable to perform operations further comprising determining the maximum rate of change based on the plurality of signal sample values, the determination comprising:
    determining, during a first time period, the maximum rate of change based on a rate of change between a first signal sample value and a second signal sample value; and
    adapting, during a second time period, the maximum rate of change based on a rate of change between a third signal sample value and a fourth signal sample value.

13. The apparatus of claim 9, wherein the controller is operable to perform operations further comprising generating an output signal sample value based on an average of the first processed signal sample value and the second processed signal sample value.

14. The apparatus of claim 9, wherein limiting a rate of change between a first processed signal sample value and a second processed signal sample value to a maximum rate of change comprises determining whether to constrain the rate of change between the first processed signal sample value and the second processed signal sample value to the maximum rate of change.

15. The apparatus of claim 9, wherein processing the plurality of signal sample values to obtain a plurality of processed signal sample values further comprises:
    reducing, prior to limiting the rate of change between the first processed signal sample value and the second processed signal sample value to the maximum rate of change, the first processed signal sample value to a determined maximum if the first processed signal sample value exceeds the determined maximum; and
    increasing, prior to limiting the rate of change between the first processed signal sample value and the second processed signal sample value to the maximum rate of change, the first processed signal sample value to a determined minimum if the first processed signal sample value is lower than the determined minimum.

16. The apparatus of claim 15, wherein:
    one or more of the plurality of signal sample values are generated during a test phase; and
    the controller is operable to perform operations further comprising setting the determined maximum and the determined minimum based on the one or more signal sample values generated during the test phase.

17. A controller, comprising:
one or more processors; and
one or more computer-readable non-transitory storage media embodying logic configured when executed by the one or more processors to perform operations comprising:
    controlling a driving circuit and a charge sensing circuit, the charge sensing circuit comprising a signal measurement capacitor, to generate a plurality of signal sample values from a plurality of measurement cycles, each of the measurement cycles comprising:
        inducing charge onto a capacitive key;
        measuring the charge induced on the capacitive key; and
        generating a signal sample value representing the charge measured from the capacitive key; and
    processing the plurality of signal sample values to obtain a plurality of processed signal sample values, the processing comprising limiting a rate of change between a first processed signal sample value and a second processed signal sample value to a maximum rate of change;
    wherein limiting the rate of change between the first processed signal sample value and the second processed signal sample value to a maximum rate of change comprises determining a rate of change between the second processed signal sample value and a first signal sample value.

18. The controller of claim 17, wherein processing the plurality of signal sample values to obtain a plurality of processed signal sample values further comprises:
    reducing, prior to limiting the rate of change between the first processed signal sample value and the second processed signal sample value to the maximum rate of change, the first processed signal sample value to a determined maximum if the first processed signal sample value exceeds a determined maximum; and
    increasing, prior to limiting the rate of change between the first processed signal sample value and the second processed signal sample value to the maximum rate of change, the first processed signal sample value to a determined minimum if the first processed signal sample value is lower than a determined minimum.

19. The controller of claim 17, wherein the maximum rate of change is adaptively determined based on a rate of change between a first signal sample value and a second signal sample value.

20. An apparatus, comprising:
    means for generating a plurality of signal sample values from a plurality of measurement cycles, each of the measurement cycles comprising:
        inducing charge onto a capacitive key;
        measuring the charge induced on the capacitive key; and
        generating a signal sample value representing the charge measured from the capacitive key; and
    means for processing the plurality of signal sample values to obtain a plurality of processed signal sample values, the processing comprising limiting a rate of change between a first processed signal sample value and a second processed signal sample value to a maximum rate of change, wherein limiting the rate of change between the first processed signal sample value and the second processed signal sample value to a maximum rate of change comprises determining a rate of change between the second processed signal sample value and a first signal sample value.

* * * * *